(12) United States Patent
Sugawara

(10) Patent No.: US 7,180,088 B2
(45) Date of Patent: Feb. 20, 2007

(54) NITRIDE BASED SEMICONDUCTOR LIGHT-EMITTING DEVICE

(75) Inventor: Hideto Sugawara, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/731,336

(22) Filed: Dec. 9, 2003

(65) Prior Publication Data

US 2004/0119082 A1    Jun. 24, 2004

(30) Foreign Application Priority Data

Dec. 19, 2002 (JP) ............................ P2002-367549

(51) Int. Cl.
*H01L 29/06* (2006.01)

(52) U.S. Cl. .......................................... 257/13; 257/79
(58) Field of Classification Search ................. 257/13, 257/79, 94, 95, 99, 103
See application file for complete search history.

(56) References Cited

FOREIGN PATENT DOCUMENTS

JP       2002-016312       1/2002

*Primary Examiner*—Douglas W. Owens
(74) *Attorney, Agent, or Firm*—Hogan & Hartson LLP

(57) ABSTRACT

Nitride based semiconductor light-emitting devices are provided with a sufficiently low contact resistance p-type electrode. The nitride based semiconductor light-emitting devices include a p-type GaN contact layer, protrusions with fine recesses (uneven portions) formed on a surface of the p-type GaN contact layer, and a p-type electrode formed on the uneven portions.

11 Claims, 8 Drawing Sheets

NITRIDE BASED SEMICONDUCTOR LIGHT-EMITTING DEVICE

FIELD OF THE INVENTION

This invention generally relates to nitride semiconductors of group III elements or nitride semiconductor light-emitting devices of mixed crystals with such elements and a method of manufacturing the same and, more particularly, to nitride based semiconductor light-emitting devices with the structure suitable for high light flux especially when driven by a large electric current (of several-hundred mA) and a method of manufacturing such light-emitting devices.

This application is based upon and claims the benefit of priority from the prior Japanese Patent Application No. 2002-367549, filed on Dec. 19, 2002, the entire contents of which are incorporated herein by reference.

BACKGROUND OF THE INVENTION

A light-emitting diode (LED) among semiconductor light-emitting devices is widely used for full color displays, traffic light apparatus, automotive equipment, and the like.

Recently, since a gallium nitride based semiconductor (InGaAlN) LED can be combined with fluorescent materials to emit white light for lightning applications, it attracts considerable attention. In addition, developments have been actively directed to a high light flux LED driven by a large electric current of more than several-hundred mA.

A method of manufacturing an LED of this kind will be explained below with reference to FIG. 11. By applying a metal organic chemical vapor deposition (MOCVD) method to sapphire substrate 101, buffer layer 102, n-type GaN contact layer 103, n-type AlGaN clad layer 104, multiple quantum well (MQW) active layer 105, p-type AlGaN clad layer 106 and p-type GaN contact layer 107 are formed on the (0001)C-plane of sapphire substrate 101 in that order.

Next, a reactive ion etching (RIE) is applied to remove portions from the multiple layers of p-type GaN contact layer 107 through n-type GaN contact layer 103 to expose an n-type electrode region of n-type GaN contact layer 103.

A p-type electrode 108 is formed on a flat upper surface of p-type GaN contact layer 107, while an n-type electrode 109 is formed on the n-type electrode region of contact layer 103, so that an LED is manufactured.

In general, magnesium (Mg) is used as a p-type impurity. It is well-known, however, that Mg has a relatively deep acceptor level in GaN crystal, and an inert acceptor effect by atom-like hydrogen. Thus, Mg added, p-type GaN contact layer 107 hardly obtains sufficient carrier concentration and becomes high in electric resistance.

In the LED manufactured in the above mentioned method, contact resistance between p-type GaN contact layer 107 and p-type electrode 108 increases, it is difficult for p-type GaN contact layer 107 to have a good ohmic contact with p-type electrode 108, and an operation voltage of the LED becomes high.

The conditions result in increase in generation of heat by the LED and bring about declines in performance and reliability.

In order to address these conditions, nitride based semiconductors and a method of manufacturing the same are well-known (see, for example, the description at page 6 and FIG. 3 of Japanese Patent Disclosure 2002-16312).

The method of manufacturing nitride based semiconductor devices disclosed in Japanese Patent Disclosure 2002-16312 will be briefly explained below with reference to FIG. 12. A sectional view of the nitride based semiconductor device (laser diode) is shown in FIG. 12. The same reference numerals are put on substantially the same components as of the conventional LED shown in FIG. 11 and their explanation is omitted here.

As shown in FIG. 12, a stripe-like uneven portion 110 (the uneven period of which is a several μm to several tens of μm, and the concave depth of which is several tens of nm to several hundreds of nm) is defined in this p-type GaN contact layer 107 and p-type electrode 108 is engaged with uneven portion 110.

In order to make uneven portion 110, a photomask made of silicon dioxide ($SiO_2$) or the like is formed on the upper surface of p-type GaN contact layer 107, photoresist is coated on so processed contact layer 107 and photolithography is applied to such coated contact layer 107 to make a stripe pattern, and a reactive ion etching (RIE) is carried out for so treated surface of p-type GaN contact layer 107.

A saw-tooth structure in a cross-sectional view and a grid-like structure of crossed rectangular stripes in a cross-sectional view are shown in Japanese Patent Disclosure 2002-16312 as structures of uneven portion 110.

Since the electrode is provided on uneven portion 110 as set forth above, a contact area of p-type electrode 108 with p-type GaN contact layer 107 increases and its contact resistance reduces.

The nitride based semiconductor device and its manufacturing method disclosed in Patent Publication 1, however, are complicated in manufacturing process, take a substantially long time to manufacture, and result in increase in production cost because they need the photolithography process to make the stripe-like uneven portion and the RIE process.

Present photolithography technology is hard to use in making a minute uneven portion with a stripe period of less than several μm of the above described limit in order to increase a contact area or to decrease electric contact resistance.

Because of the reasons set forth above, it is difficult to lower the operation voltage of the LED and also impossible to secure a sufficient voltage for a high light flux LED driven by a large electric current of more than several-hundred mA.

The reliability of the LED is likely to be affected by possible contamination of silicon from $SiO_2$ photomask, residue damages due to the RIE process, and most likely uneven stress from a molded resin in the stripe-like uneven portion.

As explained above, it is quite difficult for the manufacturing method of the nitride based semiconductor devices disclosed in Patent Publication 1 to provide those semiconductor devices with a p-type electrode of sufficiently low electric contact resistance.

SUMMARY OF THE INVENTION

It is, accordingly, an object of the present invention to provide nitride based semiconductor devices with a p-type electrode of sufficiently low electric contact resistance and a method of manufacturing the same easily.

According to one aspect of the present invention, a method of manufacturing nitride based semiconductor light-emitting devices may comprise forming of, in turn, a first conductive type nitride based semiconductor layer, an active nitride based semiconductor layer having a p-n junction, and a second conductive type nitride based semiconductor layer on a semiconductor or an insulation substrate, growing of an island-like AlGaN film on the second conductive type nitride based semiconductor, selectively etching to make uneven portions on a surface of the second nitride based semiconductor layer through the island-like AlGaN film as a photomask, and forming of an ohmic electrode on the uneven portions on the surface of the second nitride based semiconductor layer.

According to the present invention, a method of manufacturing nitride based semiconductor light-emitting devices may comprise growing of an island-like AlGaN film on the second conductive type nitride based semiconductor, selectively etching of a surface of the second conductive type nitride based semiconductor through the island-like AlGaN film used for a photomask to make uneven portions on the surface of the second conductive type nitride based semiconductor. Thus, the second conductive type nitride based semiconductor easily increases its contact area with the electrode and is provided with sufficiently low electric contact resistance.

According to a second aspect of the present invention, a nitride based semiconductor light-emitting device may comprise a semiconductor or insulation substrate, a first conductive type nitride based semiconductor formed on the substrate, an active layer formed on the first conductive type nitride based semiconductor and made from a nitride based semiconductor with a p-n junction, a second conductive type nitride based semiconductor formed on the active layer, a surface of second conductive type nitride based semiconductor provided with uneven portions, a first ohmic electrode formed on the surface of the second conductive type nitride based semiconductor, and a second ohmic electrode formed on the first conductive type nitride based semiconductor.

Thus, the uneven portions formed on the surface of the second conductive type nitride based semiconductor result in increase of a contact area with the first electrode and provide sufficiently low electric contact resistance.

BRIEF DESCRIPTION OF THE DRAWINGS

A more complete appreciation of the present invention and many of the attendant advantages thereof will be readily obtained as the same becomes better understood by reference to the following detailed descriptions when considered in connection with the accompanying drawings, wherein.

DETAILED EXPLANATION OF THE PREFERRED EMBODIMENTS

Figure 1:
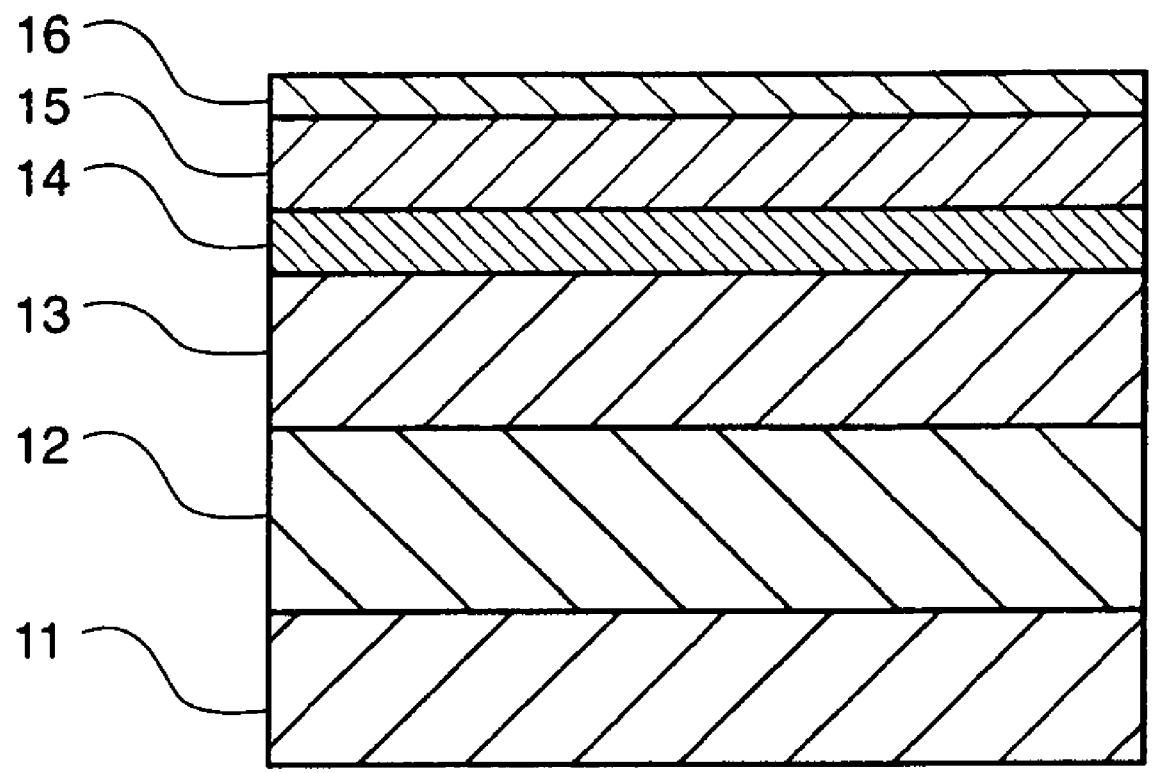
FIG. 1 shows a schematically sectional view of a nitride based semiconductor light-emitting device made in the first step of a method of manufacturing the same in accordance with the first embodiment of the present invention.

Embodiments of the present invention will be explained below with reference to the attached drawings. It should be noted that the present invention is not limited to the embodiments but covers their equivalents. Throughout the attached drawings, similar or same reference numerals show similar, equivalent or same components. The drawings, however, are shown schematically for the purpose of explanation so that their components are not necessarily the same in shape or dimension as actual ones. In other words, concrete shapes or dimensions of the components should be considered as described in these specifications, not in view of the ones shown in the drawings. Further, some components shown in the drawings may be different in dimension or ratio from each other.

First Embodiment

FIGS. 1–7 show sectional views of a nitride based semiconductor device made by a series of portions of a method of manufacturing the same in accordance with the first embodiment of the present invention.

As shown in FIG. 1, a nitride based semiconductor layer is grown on the (0001)C-plane of a sapphire substrate 11. Here, hydrogen or mixed gases of hydrogen and nitrogen are used as carrier gases. Organic metal compounds Al, Ga, and In of trimethylaluminum (TMA), trimethylgallium (TMG) and trimethylindium (TMI) are utilized for group III material gases while ammonia ($NH_3$) is utilized for a group V material gas. A silane gas ($SiH_4$) is employed as an n-type dopant, i.e., a first conductive types semiconductor while organic metal compounds of magnesium, e.g., bis (cyclopentadienyl) magnesium (Cp2Mg) is employed as a p-type dopant, i.e., a second conductive types semiconductor.

At the beginning, sapphire substrate 11 is set in a reaction chamber of a metal organic chemical vapor deposition (MOCVD) apparatus. After contents of the chamber are fully substituted for hydrogen, the substrate is heated up to a temperature of 1050° C. while hydrogen flows into the chamber so that a thermal cleaning of the substrate is carried out.

Next, n-type GaN contact layer 12 and n-type AlGaN clad layer 13 which are doped with Si are, by turns, formed on sapphire substrate 11 as the first conductive type nitride based semiconductor layers. Since the n-type GaN contact layer 12 doped with Si gains high carrier concentration, it has sufficiently low electric contact resistance with an n-type electrode.

Subsequently, MQW active layer 14 is formed comprising a nitride based semiconductor layer with a p-n junction. The structure of MQW active layer 14 is multiple layers of InGaN/GaN. Its light-emitting wavelength can be suitably selected from those of blue-green to ultraviolet in accordance with In compositions of the InGaN semiconductor layer.

Then, as the second conductive type nitride based semiconductor layers, p-type AlGaN clad layer 15 and p-type GaN contact layer 16 both doped with magnesium Mg are, by turns, formed on n-type AlGaN clad layer 13.

Figure 2A:
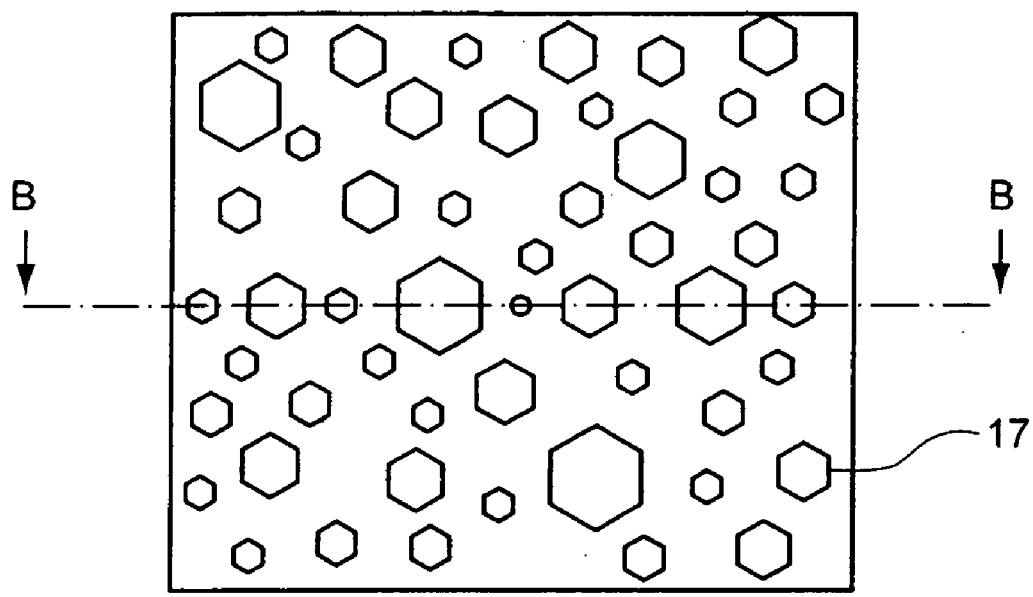
FIG. 2A is a schematic plan view of the nitride based semiconductor light-emitting device made in the second step of the manufacturing method in accordance with the first embodiment of the present invention.
Figure 2B:
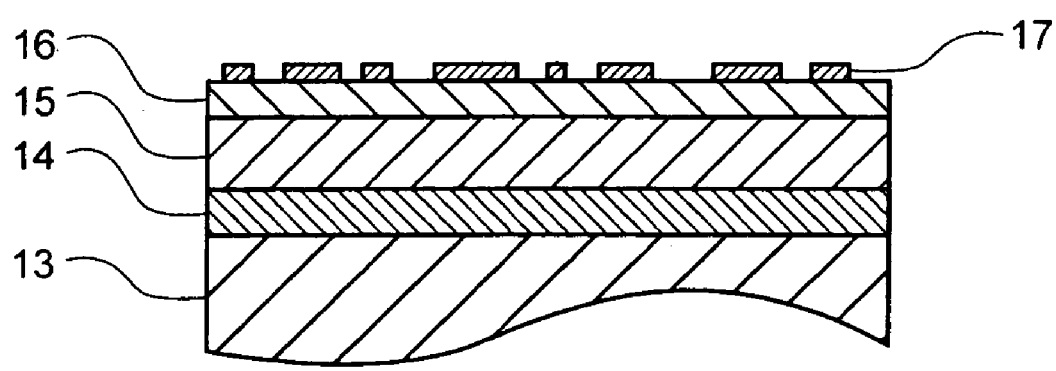
FIG. 2B is a schematically sectional view of the nitride based semiconductor light-emitting device cut along line B—B of FIG. 2A.

As shown in FIGS. 2A and 2B, p-type AlGaN films 17 are grown on p-type GaN contact layer 16. FIG. 2A is a schematic plan view of p-type AlGaN films 17. FIG. 2B is a schematically sectional view of p-type AlGaN films 17 cut along dotted and chain line B—B of FIG. 2A and seen from the arrows' direction.

In general, a growing temperature of the AlGaN semiconductor ranges from 800° C. to 1200° C. and, more suitably, from 900° C. or more for the AlGaN semiconductor to easily grow in a two-dimensional direction to 1150° C. or less for the AlGaN semiconductor to actively thermally decompose.

Here, the growing temperature of the p-type AlGaN semiconductor is set at 900° C., for instance, to prevent it from two dimensional growth. Thus, the AlGaN semiconductor is grown in a three-dimensional direction into island-like AlGaN films 17 with many, substantially, hexagons of several µm to several tens of µm in width.

The shapes of those islands can be controlled by nitrogen used for a carrier gas, flowing rates of mixed gases of hydrogen and nitrogen, or changes in growing temperature.

Further, when island-like AlGaN films 17 become a predetermined thickness, e.g., 0.1 µm, the material gases of TMA and TMG are stopped and island-like AlGaN films 17 cease growing.

Figure 3:
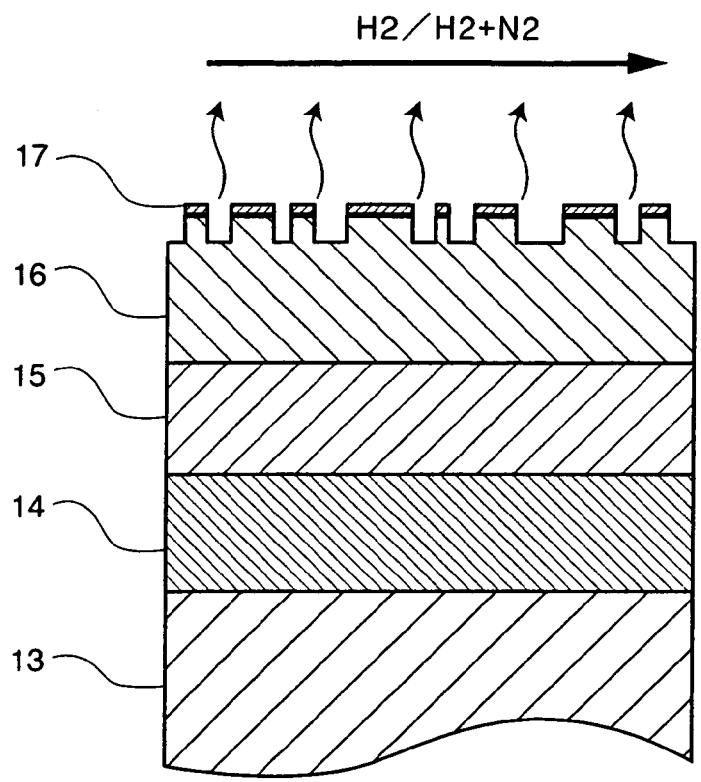
FIG. 3 is a schematically sectional view of the nitride based semiconductor light-emitting device made in the third step of the manufacturing method in accordance with the first embodiment of the present invention.

As shown in FIG. 3, the surface of p-type GaN contact layer 16 is etched through island-like AlGaN films 17 as a photomask by exposing p-type GaN contact layer 16 to hydrogen or mixed gasses of hydrogen and nitrogen. This treatment can be carried out successively by stopping supplying an ammonium gas after island-like AlGaN films 17 cease growing.

Applicant's experiments show that the etching speed of p-type GaN contact layer 16 can be controlled by selection of atmospheric gases or treatment temperature, and further that it can be also controlled by composition rates of Al to island-like AlGaN films 17.

By way of example, where the atmospheric gases are mixed ones of hydrogen and nitrogen at the mixing rate of H2: N2=1:9 and the treatment temperature is at 900° C., the etching rate is 0.002 µm/sec. Where the atmospheric gas is hydrogen and the treatment temperature is at 1,000° C., the etching rate is 0.4 µm/sec.

Figure 4:
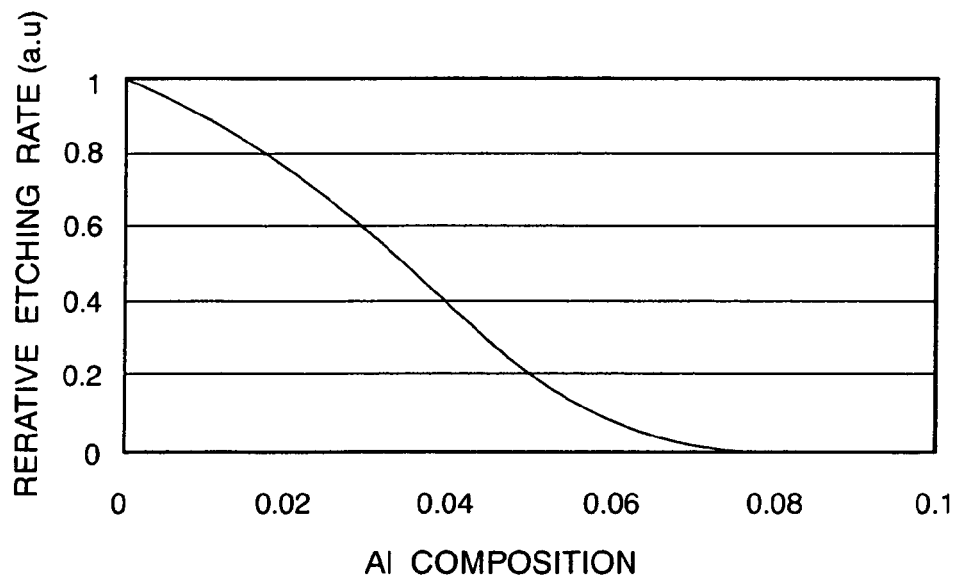
FIG. 4 is a relative etching rate characteristic with respect to Al composition in an AlGaN semiconductor device made in accordance with the manufacturing method of the first embodiment of the present invention.

FIG. 4 shows a relative etching rate characteristic with respect to Al composition in AlGaN films with respect to a GaN contact layer in atmospheric gas of hydrogen at the treatment temperature of 900° C. As shown in FIG. 4, the etching rate of AlGaN films is ⅕ of that of GaN contact layer at Al composition ratio of 0.05 but no substantial etching of the former is carried out at Al composition ratio of 0.07 or more.

As set forth above, p-type GaN contact layer 16 can be selectively etched by using p-type AlGaN films 17 as a photomask.

Figure 5A:
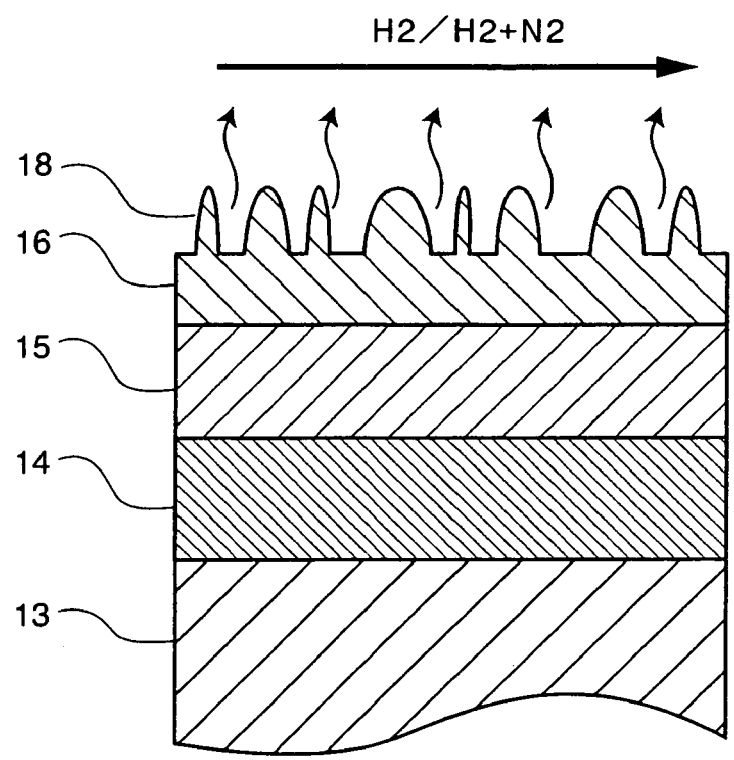
FIG. 5A is a schematically sectional view of the nitride based semiconductor light-emitting device made in the fourth step of the manufacturing method in accordance with the first embodiment of the present invention.

Island-like AlGaN films 17 are 0.1 µm in thickness, Al composition ratio is 0.05, a mixed gas ratio of hydrogen and nitrogen H2:N2=1:1, and the etching is carried out at a temperature of 900° C. until the photomask of island-like AlGaN films 17 vanishes, as shown in FIG. 5A, to make a plurality of mixed protrusions 18 small or large.

Figure 5B:
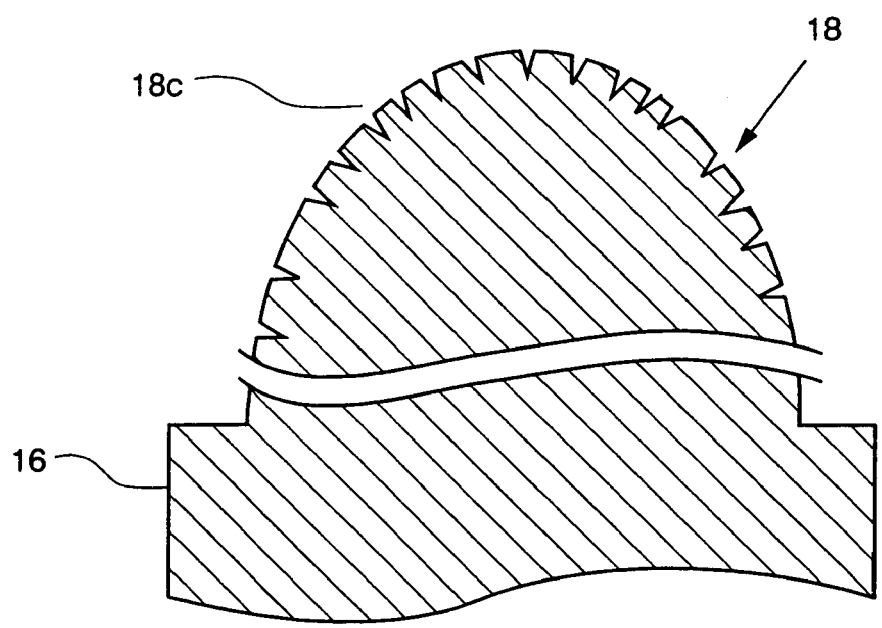
FIG. 5B is a partially enlarged sectional view of the nitride based semiconductor light-emitting device shown in FIG. 5A.

Here, microscopic observations show that the surface of the protrusion is rough and that many minute recesses 18c are defined on it as shown in FIG. 5B. It is assumed that thermal decomposition occurs at the outer layer of p-type GaN contact layer 16 to result in the recesses 18c when the etching is carried out.

After the etching treatment, metal droplets of Ga sometimes remain on the surface of p-type GaN contact layer 16. Substrate 11 is taken out from the reaction chamber after the etching treatment and is processed by chlorine system etchant so that the metal droplets can be removed from the surface of p-type GaN contact layer 16.

Next, activation treatment is performed for Mg doped p-type GaN contact layer 16 to make its resistivity equal to or less than 1 Ωcm.

Figure 6:
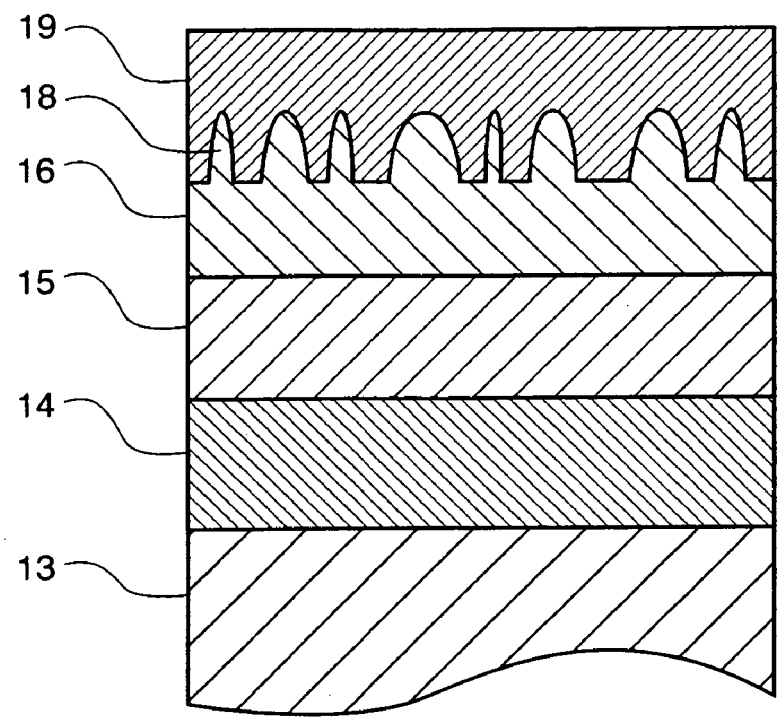
FIG. 6 is a schematically sectional view of the nitride based semiconductor light-emitting device made in the fifth step of the manufacturing method in accordance with the first embodiment of the present invention.
Figure 7:
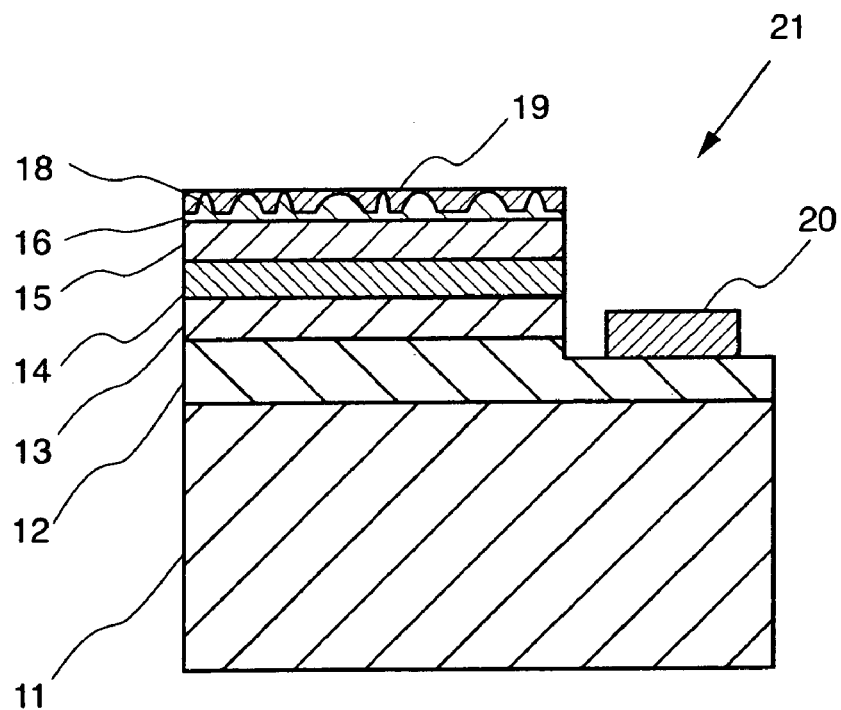
FIG. 7 is a schematically sectional view of the nitride based semiconductor light-emitting device made in the sixth step of the manufacturing method in accordance with the first embodiment of the present invention.

Nickel (Ni) and gold (Au) are then vapor-deposited on recesses 18c of protrusions 18 and the surface of p-type GaN contact layer 16 to which thermal treatment is further applied to form p-type electrode 19 as shown in FIG. 6.

A photolithography method is employed to form a transmission line pattern on p-type electrode 19. Applicant's measurement shows that its contact resistance is $2 \times 10^{-4}$ Ωcm$^2$, i.e., that it can reduce to ⅕ of that of a prior art plane electrode contact resistance of $1 \times 10^{-3}$ Ω cm$^2$.

This improvement rate is much greater than an increment rate of the outer layer by protrusions 18. Although its reason is now unclear, it is possible to suppose that something makes contact characteristics improved on sides different in plane direction from the planes of uneven portions. Electrode materials, for example, enter into recesses 18c of protrusions 18 to increase contact areas.

Further, there are regions in the outer layer of protrusions 18 where a group V element of nitrogen is lost and III–V crystalline structure is destroyed, i.e., the "regions that are from stoichiometric compositions". They may be related to such improvement.

In this way, the formation of protrusions 18 on p-type GaN contact layer 16 makes contact resistance between p-type GaN contact layer 16 and p-type electrode 19 reduced. In addition, recesses 18c of protrusions 18 make such contact resistance much lower.

Next, an RIE method is applied to remove a part of the layers ranging from p-type GaN contact layer 16 through n-type GaN contact layer 12 to expose the n-type electrode region of n-type GaN contact layer 12.

Titanium and aluminum Ti and Al are vapor-deposited on the exposed flat plane of the n-type electrode region to which thermal treatment is further applied to form n-type electrode 20. Thus, a light-emitting diode LED 21 with the structure of transparent p-type electrode 19 is produced.

When this LED 21 is mounted on a lead frame, not shown, and is operated, an operation voltage is 3.2 V with an operation current of 200 mA. Thus, such an operation voltage is lower than that of 3.5 V of a prior art structured LED that has no protrusions 18 on p-type GaN contact layer 16.

Further, output light measured after the LED 21 is covered with a molding material, not shown, is found to improve to an extent of 10% increase. This improvement in optical output efficiency of LED 21 supposedly results from light-scattering effects of small or large protrusions 18. The reliability of a molding resin is equal to that of a prior art one.

As described above, the method of manufacturing nitride based semiconductor light-emitting devices according to the first embodiment of the present invention includes the step to continuously form protrusions 18 on p-type GaN contact layer 16 in the reaction chamber of the metal organic chemical vapor deposition (MOCVD) apparatus using island-like AlGaN films 17 as a photomask.

Thus, contact areas between p-type GaN contact layer and p-type electrode 19 increase and sufficiently low contact resistance can be obtained. Their manufacturing process is easy and simple because it is unnecessary to use a photolithography step or an RIE step.

Second Embodiment

FIGS. 8A–8D are sectional views of a series of forming steps of protrusions 18 in a method of manufacturing nitride based semiconductor light-emitting devices according to the second embodiment of the present invention. The components of this embodiment which are the same as or similar to the first embodiment have the same reference numerals as for the latter and their explanation are omitted here for simplicity.

As shown in the drawings, steps of the second embodiment that are different from those of the first one are directed to two-time repeating formation of much sharper protrusions 18.

Figure 8A:
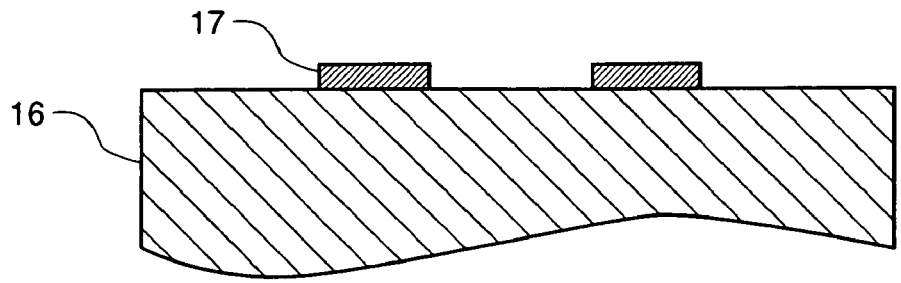
FIGS. 8A–8D are schematic process diagrams of a nitride based semiconductor light-emitting device made by a method of manufacturing the same in accordance with the second embodiment of the present invention.
Figure 8B:
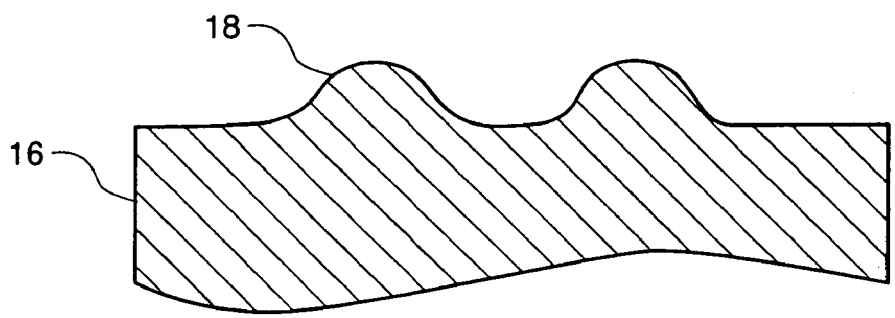

After island-like p-type AlGaN films 17 properly are grown on p-type GaN contact layer 16, the surface of p-type GaN contact layer 16 is etched to form protrusions 18 by using p-type AlGaN films 17 as a photomask as shown in FIGS. 8A and 8B.

Figure 8C:
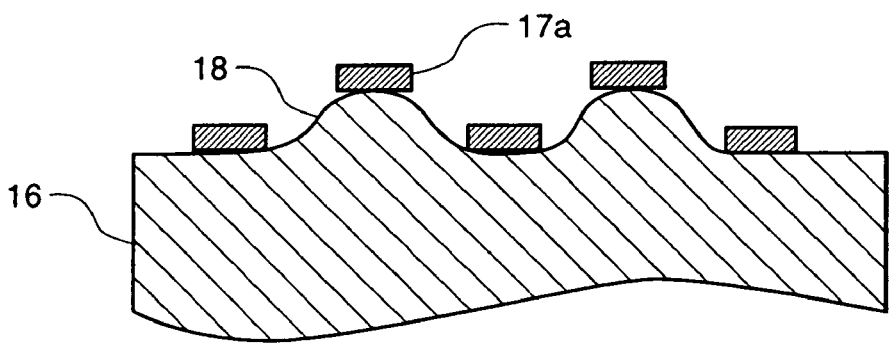

Next, as shown in FIG. 8C, island-like AlGaN films 17a that are smaller in size than island-like AlGaN films 17 are again grown on p-type GaN contact layer 16 with protrusions 18.

It is desirable to grow the islands in a lower temperature where the islands are made smaller in size. It is possible to make the islands even less than several µm in size.

Thus, island-like AlGaN films 17a can be formed on the top of protrusions 18 and between protrusions 18. AlGaN films 17a are also formed on the side surfaces of protrusions 18 but the films are removed and disappears by etching in the next step so that the films do not remarkably affect the semiconductor light-emitting device.

Figure 8D:
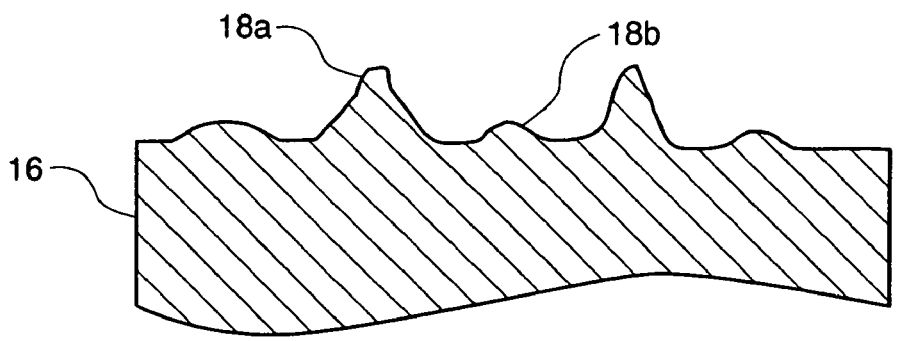

Next, as shown in FIG. 8D, p-type GaN contact layer 16 is etched again by using island-like AlGaN films 17a as a photomask. Thus, high and acute protrusions 18a and new ones 18b are formed.

As shown in FIG. 8D, protrusion 18a is higher in height and wider in width than protrusion 18b.

Many small and large protrusions 18a and 18b are formed in this way so that contact areas with the p-type electrode increase and its contact resistance becomes lower.

As described above, the method of manufacturing nitride based semiconductor light-emitting devices according to the second embodiment of the present invention includes steps to continuously form protrusions 18a and 18b on p-type GaN contact layer 16 in the reaction chamber of the MOCVD apparatus using island-like AlGaN films 17 and 17a as photomasks.

Thus, contact areas between p-type GaN contact layer 16 and p-type electrode 19 further increase and sufficiently lower contact resistance can be obtained. Their manufacturing process is easy and simple because it is unnecessary to use a photolithography and an REI method.

Figure 9:
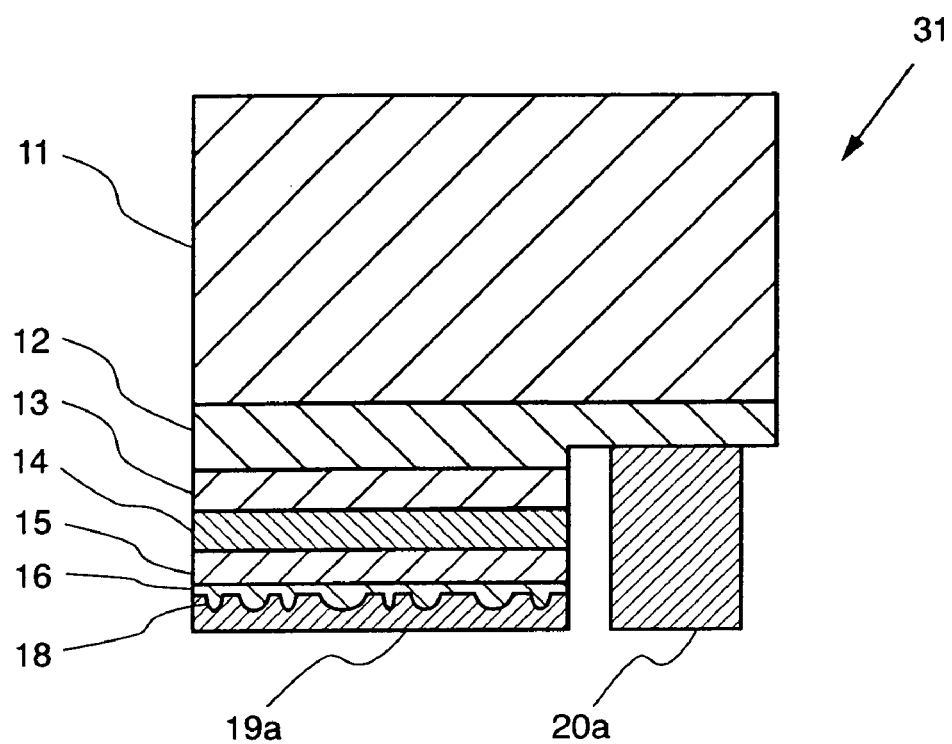
FIG. 9 is a schematically sectional view of a nitride based semiconductor light-emitting device of the present invention.

Next, a further embodiment of a nitride based semiconductor light-emitting device will be explained below with reference to FIGS. 9 and 10. FIG. 9 is a sectional view of the nitride based semiconductor light-emitting device manufactured by the method in accordance with the first embodiment of the present invention.

As shown in FIG. 9, this light-emitting device of the embodiment includes Si doped n-type GaN contact layer 12 as a first conductive type nitride based semiconductor layer and n-type AlGaN clad layer 13 which are, by turn, formed on the (0001) C plane of sapphire substrate 11. The multi-layer structure of InGa/GaN of MQW active layer 14 is formed on n-type AlGaN clad layer 13 as an active layer of a nitride based semiconductor layer with a p-n junction. Further, Mg doped p-type AlGaN clad layer 15 and p-type GaN contact layer 16 are, by turn, formed as second conductive type nitride based semiconductor layers.

The p-type GaN contact layer 16 has small and large protrusions 18 formed on its surface. Large protrusions 18 are several µm to several tens of µm in size while small ones 18 are hundreds of nm to several µm in size but protrusions 18 are hundreds of nm to 1 µm in height. The density of protrusions 18 is approximately $10^4$ mm$^{-2}$.

Further, p-type electrode 19a of Ni/Au is formed on an electrode forming area of p-type GaN contact layer 16 with protrusions 18.

An RIE method is applied to etch p-type GaN contact layer 16 through part of n-type GaN contact layer 12. Then, the part of n-type GaN contact layer 12 is exposed to make an electrode forming area on which n-type electrode 20a of Ti/Al is formed. Thus, a flip-chip type LED 31 is produced.

Figure 10:
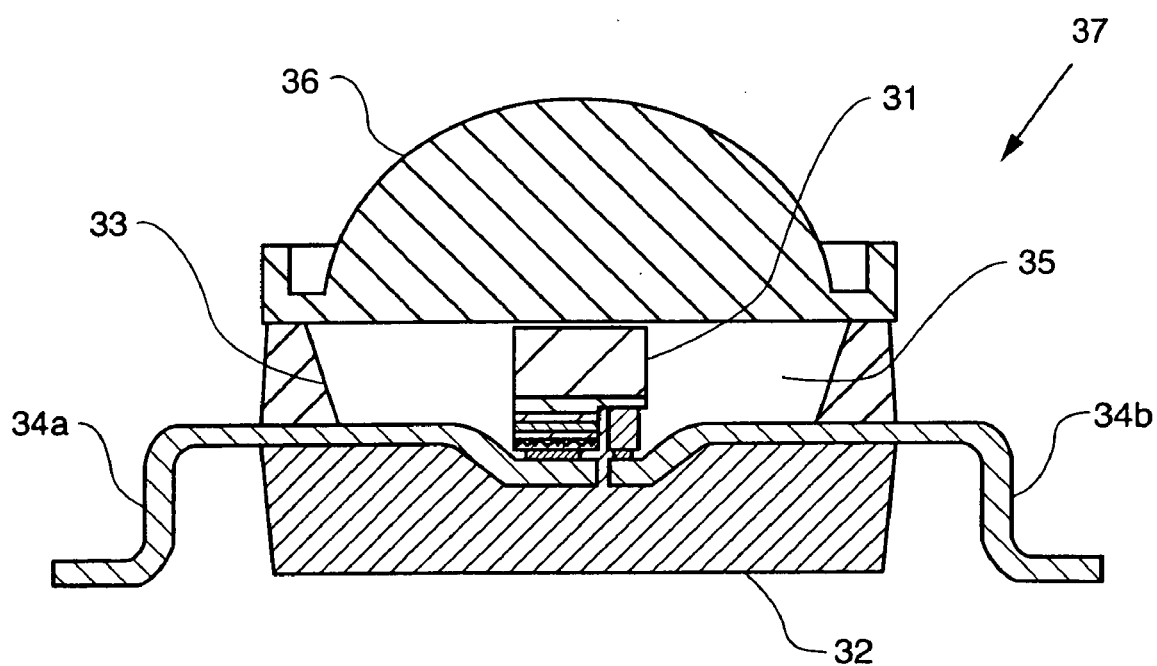
FIG. 10 is a schematically sectional view of a nitride based semiconductor light-emitting apparatus of the present invention.
Figure 11:
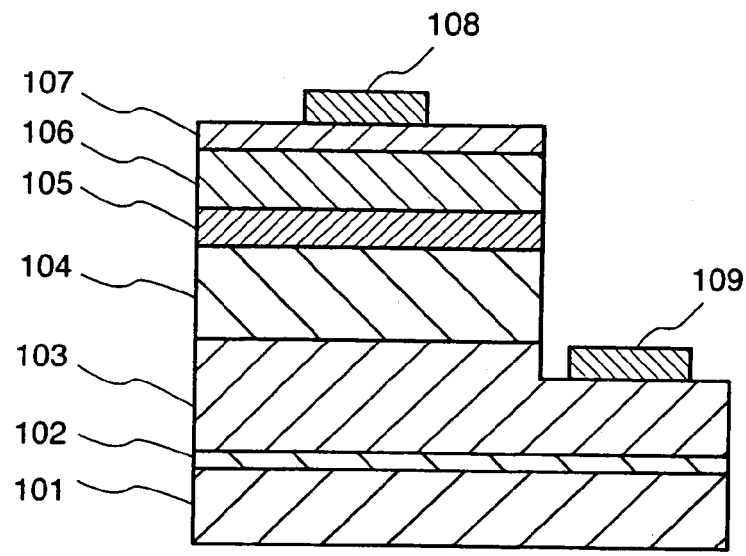
FIG. 11 is a schematically sectional view of a nitride based semiconductor light-emitting device made by a prior art method of manufacturing the same.
Figure 12:
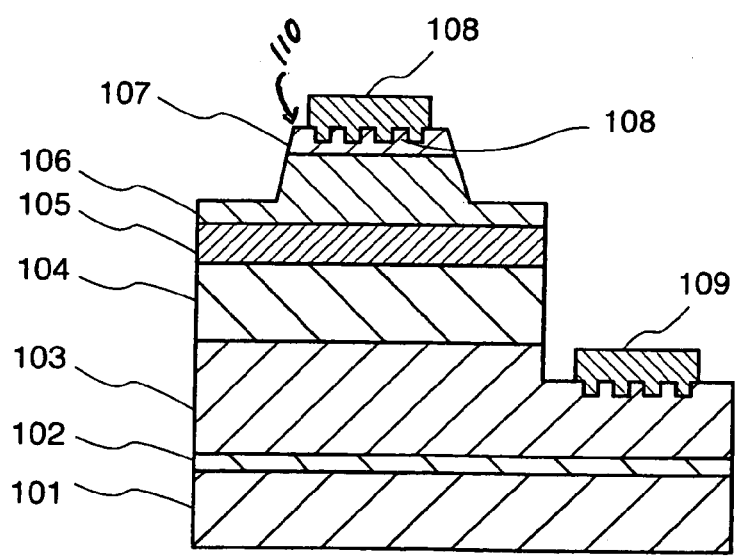
FIG. 12 is a schematically sectional view of a nitride based semiconductor light-emitting device with an uneven electrode defining surface made by a prior art method of manufacturing the same.

FIG. 10 is a sectional view of a nitride based semiconductor light-emitting device incorporated with LED 31 shown in FIG. 9.

As shown, LED 31 is set on reflection cup 33 to make sapphire substrate 11 a light-emitting observation plane while p-type electrode 19a and n-type electrode 20a are fixed on lead frame 34a and 34b by ball bonding, respectively.

Transparent gel resin material 35 is filled in reflection cup 33 and transparent resin lens 36 is fixed to enclosure 32 to make nitride based semiconductor light-emitting apparatus 37.

This semiconductor light-emitting apparatus 37 operates at 3.2 V with an operation current of 200 mA. The operation voltage of 3.2 V can be reduced in comparison with that of 3.5 V of a prior art semiconductor light-emitting apparatus without protrusions 18 on p-type GaN contact layer 16.

Further, when the operation current is increased, the entire surface of the activated layer emits light while no substantial current is concentrated at any portions. Its light output saturation due to generated heat is not observed nor is its reliability deteriorated, either.

As explained above, according to the nitride based semiconductor light-emitting device of the present invention, protrusions 18 formed on p-type GaN contact layer 16 increases its contact area with p-type electrode 19a, and provides sufficiently lower contact resistance, and a sufficiently lower operation voltage can be obtained for a high optical flux LED driven by a large current.

As many apparently different embodiments of the present invention may be widely made without departing from its spirit and scope, it is to be understood that the invention is not limited to the specific embodiments set forth above. Instead of forming island-like AlGaN films 17 and subsequently etching GaN contact layer 16 by using island-like AlGaN films 17 as a photomask in the same reaction chamber, those processes may be carried out in separate reaction chambers.

The contact layer 16 is not limited to p-type GaN semiconductors but may also be nitride based semiconductors including Al or In.

Although the process is repeated twice to form protrusions 18a and 18b, additional processes may be repeated while changing the size or thickness of island-like AlGaN films 17 and Al composition rates.

Further, sapphire substrate 11 may be substituted for SiC or GaN semiconductor substrates.

The present invention easily provides nitride based semiconductor light-emitting devices with a sufficiently lower resistance p-type electrode and a sufficiently lower operation voltage, and a method of manufacturing the same.

What is claimed is:

1. A nitride based semiconductor light-emitting device comprising:
   a substrate;
   a first conductive type nitride based semiconductor layer formed on the substrate;
   an active layer with a p-n junction formed on said first conductive type nitride based semiconductor layer, said active layer being made of a nitride based semiconductor layer having the p-n junction;
   a second conductive type nitride based semiconductor layer formed on said active layer, said second conductive type nitride based semiconductor layer being provided with protrusions, wherein fine recesses are formed on surfaces of the protrusions;
   a first ohmic electrode formed on surfaces of the fine recesses and the protrusions of said second conductive type nitride semiconductor layer; and
   a second ohmic electrode formed on said first conductive type nitride based semiconductor layer, wherein light is emitted from the first ohmic electrode.

2. A nitride based semiconductor light-emitting device according to claim 1, wherein said protrusions have small and large ones.

3. A nitride based semiconductor light-emitting device according to claim 2, wherein said large protrusions are wider in width than the small protrusions.

4. A nitride based semiconductor light emitting device according to claim 1, wherein the first ohmic electrode is optically transparent.

5. A nitride based semiconductor light-emitting device comprising:
   a substrate;
   a first conductive type nitride based semiconductor layer formed on the substrate;
   an active layer with a p-n junction formed on said first conductive type nitride based semiconductor layer, said active layer being made of a nitride based semiconductor layer having the p-n junction;
   a second conductive type nitride based semiconductor layer formed on said active layer, said second conductive type nitride based semiconductor layer being provided with protrusions whose surfaces include regions out of stoichiometric compositions;
   a first ohmic electrode formed on the surface of said second conductive type nitride based semiconductor layer; and
   a second ohmic electrode formed on said first conductive type nitride based semiconductor layer.

6. A nitride based semiconductor light-emitting device according to claim 5, wherein said protrusions have small and large ones.

7. A nitride based semiconductor light-emitting device according to claim 6 wherein said large protrusions are higher in height than the small protrusions.

8. A nitride based semiconductor light-emitting device according to claim 6, wherein said large protrusions are wider in width than the small protrusions.

9. A nitride based semiconductor light-emitting device, comprising:
   a substrate;
   a first conductive type nitride based semiconductor layer formed on the substrate;
   an active layer with a p-n junction formed on said first conductive type nitride based semiconductor layer, said active layer being made of a nitride based semiconductor layer having the p-n junction;
   a second conductive type nitride based semiconductor layer formed on said active layer, said second conductive type nitride based semiconductor layer being provided with at least two sizes of protrusions formed on a surface of the second conductive type nitride based semiconductor layer, wherein fine recesses are formed on surfaces of the protrusions;
   a first ohmic electrode formed on surfaces of the fine recesses and the protrusions of said second conductive type nitride based semiconductor layer; and
   a second ohmic electrode formed on said first conductive type nitride based semiconductor layer, wherein light is emitted from the first ohmic electrode.

10. A nitride based semiconductor light-emitting device according to claim 9, wherein said protrusions have small and large ones and said large protrusions are wider in width than the small protrusions.

11. A nitride based semiconductor light emitting device according to claim 9, wherein the first ohmic electrode is optically transparent.

* * * * *